US005526431A

United States Patent [19]

Shioda

[11] Patent Number: 5,526,431

[45] Date of Patent: * Jun. 11, 1996

[54] SOUND EFFECT-CREATING DEVICE FOR CREATING ENSEMBLE EFFECT

[75] Inventor: Kazuaki Shioda, Shizuoka-ken, Japan

[73] Assignee: Kabushiki Kaisha Kawai Gakki Seisakusho, Shizuoka-ken, Japan

[ * ] Notice: The term of this patent shall not extend beyond the expiration date of Pat. No. 5,432,856.

[21] Appl. No.: 412,203

[22] Filed: Mar. 27, 1995

Related U.S. Application Data

[63] Continuation of Ser. No. 81,936, Jun. 25, 1993, abandoned.

[30] Foreign Application Priority Data

Jun. 25, 1992 [JP] Japan .................................... 4-191547
Jun. 25, 1992 [JP] Japan .................................... 4-191548

[51] Int. Cl.$^6$ .................................................... H03G 3/00

[52] U.S. Cl. ................................ 381/61; 84/660; 84/630; 381/63

[58] Field of Search .................................. 381/61, 1, 63; 84/624, 625, 629, D 26, 660, 630

[56] References Cited

U.S. PATENT DOCUMENTS

| | | | |
|---|---|---|---|
| 5,036,541 | 7/1991 | Kato | 381/62 |
| 5,050,216 | 9/1991 | Hanzawa et al. | 84/629 |
| 5,241,604 | 8/1993 | Noguchi | 84/DIG. 26 |
| 5,256,830 | 10/1993 | Takeuchi et al. | 84/DIG. 26 |
| 5,432,856 | 7/1995 | Shioda | 381/63 |
| 5,444,180 | 8/1995 | Shioda | 381/63 |

*Primary Examiner*—Forester W. Isen
*Assistant Examiner*—Ping W. Lee
*Attorney, Agent, or Firm*—Evenson, McKeown, Edwards & Lenahan

[57] ABSTRACT

A sound effect-creating device frequency-modulates a monaural original sound signal obtained from stereophonic sound signals, delays the resulting modulated signal by delay amounts different from each other, selects and adds up a combination of a plurality of delayed modulated signals to form signals to be added to the stereophonic sound signals, and outputs the resulting stereophonic sound signals.

18 Claims, 7 Drawing Sheets

SOUND EFFECT-CREATING DEVICE FOR CREATING ENSEMBLE EFFECT

This application is a continuation of application Ser. No. 08/081,936, filed on Jun. 25, 1993, now abandoned.

BACKGROUND OF THE INVENTION

1. Field of the Invention

This invention relates to a sound effect-creating device used in electronic musical instruments and the like, and more particularly to a sound effect-creating device comprising signal-modulating means, a plurality of signal-delaying means, and signal-mixing means, a combination of which can be freely selected by a player for operating the device, to thereby impart, to original musical sounds to be created by his or her performance, a so-called ensemble effect comprising various effects including the chorus effect which gives his or her listeners the impression that they were listening to music played by a plurality of players.

2. Prior Art

In electronic musical instruments, such as electronic pianos and other electronic keyboard instruments, an artificial musical sound in an audio frequency range, which corresponds to a key of the keyboard selectively depressed by a player, is synthesized by electronic computation. In such electronic synthesis, the artificial musical sound is not only synthesized in a desired tone color and tone quality, but also often imparted with various sound effects produced according to settings selectively made for control thereof by the player via switches, volume knobs, and the like of the instrument. The ensemble effect includes a so-called chorus effect, i.e. the effect of making one player's listeners feel as if they were listening to music played by a plurality of players, as well as the vibrato effect of giving slight and rapid vibrations in pitch. As a result, the listeners can feel as if they were present in a concert hall, listening to music played by a plurality of players. Therefore, in the field of the electronic musical instruments, how to realize the ensemble effect is a very important technique in designing an instrument.

FIG. 1 shows a conventional sound effect-creating device which is adapted to artificially impart such sound effects to an artificial musical sound produced by an electronic musical instrument. In the figure, a sound effect-creating device generally designated by reference numeral 71 has frequency modulators 72, 73 and 74. These frequency modulators are supplied via respective signal input terminals 72*a*, 73*a* and 74*a* with a signal artificially synthesized by means therefor, not shown, which is representative of an artificial musical sound to be produced by the electronic musical instrument. This signal before modification for imparting the artificial sound effects to the artificial musical sound will be hereinafter referred to as "the original sound signal". The frequency modulators are supplied, via respective modulating signal input terminals 72*b*, 73*b*, and 74*b* thereof, with modulating signals each having a frequency of 5 Hz and being shifted in phase by 120 degrees from each other, which are also synthesized by means therefor, not shown. Further, these frequency modulators 72, 73, and 74 have output terminals 72*c*, 73*c*, and 74*c* connected to input terminals 75*a*, 75*b*, 75*c* of a mixer 75, respectively. The mixer 75 has an output terminal 75*d* connected to an arithmetic unit, not shown.

According to this sound effect-creating device 71, the original sound signal is supplied via the signal input terminals 72*a*, 73*a*, 74*a* to the frequency modulators 72, 73, and 74, separately and simultaneously, where the input signals are separately frequency-modulated by the modulating signals input via the modulating signal input terminals 72*b*, 73*b*, and 74*b*, respectively. The resulting modulation signals are supplied to the mixer 75, where they are added up to form a mixed signal. In this case, through the above frequency modulations, each modulation signal has a swell having a frequency of 5 Hz. Further, the frequency modulations are effected by the respective modulating signals different in phase from each other by 120 degrees, so that the resulting modulation signals interfere with each other when they are added up by the mixer 75, to produce a lot of mutual modulation components. As a result, the resulting mixed modulation signal is in such a modified form that it will realize the ensemble effect consisting of the vibrato effect of giving vibrations to a musical sound through swell of the frequency of the resulting signal and the chorus effect of making one player's listeners feel as if they were listening to music played by a plurality of player, which is effected through the many mutual modulation components of the signal.

However, such a conventional sound effect-creating device suffers from the following inconveniences: First, since provision of a plurality of frequency modulators is required, the circuit configuration of the device is complicated. Particularly with a sound effect-creating device of a digital type, when an encoded original sound signal is frequency-modulated by a digital circuit, it is required to shift the phase of a clock used in selecting addresses storing data of the encoded original sound signal. This results in a technically difficult requirement of substantially increasing the frequency of the clock to perform high-speed computation. Moreover, the use of a plurality of frequency modulation circuits as described above requires parallel processing of data, and hence it is required to use a computer having high-speed processing capability in order to control the whole frequency modulation circuits, and at the same time to employ a complicated processing method.

Further, although the produced sound effects per se include the vibrato effect and the chorus effect, they are merely based on different phases of the modulating signals and hence even with the presence of a plurality of signal components resulting from the artificial diversification described above, the intervals of time between the components are not long enough to produce a sufficiently deep chorus effect. Further, they cannot give the listeners a sufficient degree of the sense of spread of sound for them to enjoy the sense of concert hall presence.

SUMMARY OF THE INVENTION

The present invention has been made in view of these circumstances, and it is an object of the invention to provide a sound effect-creating device in a simplified circuit configuration which is capable of imparting to artificial musical sounds an ensemble effect including a vibrato effect, a chorus effect, and a stereophonic effect.

To attain the above object, according to a first aspect of the present invention, there is provided a sound effect-creating device comprising:

signal-modulating means for frequency-modulating a sound signal representative of a musical sound, to form a modulation signal;

a plurality of signal-delaying means for each separately delaying the modulation signal from the signal-modulating means, by respective delay amounts different from each other, to form delayed modulation signals; and signal-mixing means for selecting and adding up a combination of desired ones of the delayed modulation signals to output a mixed signal.

According to the sound effect-creating device of the invention, a swell is produced in the sound signal due to frequency-modulation of thereof, which creates a vibrato effect. Further, the modulation signal is largely delayed in time by the plurality of the signal-delaying means to form a plurality of largely-delayed modulation signals having the same frequency, so that there can be realized the effect of giving listeners impressions as if they were listening to music played by a plurality of players, i.e. the chorus effect.

Preferably, the signal-mixing means comprises a plurality of mixing circuits for each selecting and adding up a combination of desired ones of the delayed modulation signals output from the plurality of signal-delaying means to output a mixed signal.

More preferably, each of the signal-delaying means supplies part of the delayed modulation signal to an input side of the each of the signal-delaying means in a feedback manner.

According to this preferred embodiment, since a portion of a signal remains in the following part of the same signal as a component thereof, there is created an echo effect.

Further preferably, the signal-mixing means has an amplitude control circuit for controlling an amplitude level of each of the delayed modulation signals supplied thereto.

According to this preferred embodiment, by varying the amplitude level of each delayed modulation signal, it is possible to vary a sensed spread of sound in various ways, which increases the stereophonic effect.

When the amplitude control circuit inverts the sign of an amplitude level of at least one of the delayed modulation signals, there are produced a lot of delayed modulation signal components in the resulting signal, which are identical in frequency but different only in phase by 180 degrees, which further increases the stereophonic effect, giving listeners impressions of an even wider spread of a sound.

Further, if a delayed modulation signal which is only slightly different in phase is added by properly selecting delay amounts of the plurality of signal-delaying means, the delayed modulation signals interfere with each other to produce a large number of mutually-modulated signal components in the resulting signal, creating a larger vibrato effect.

It is preferred that the signal-modulating means, the signal-delaying means, and the signal-mixing means are formed by a digital signal processor.

According to a second aspect of the invention, there is provided a sound effect-creating device comprising:

a plurality of channels for transmitting sound signals for producing a stereophonic sound;

first signal-mixing means for taking out sound signals for producing the stereophonic sound from at least two of the plurality of channels, and adding up the sound signals taken out, to form a monaural signal;

signal-modulating means for frequency-modulating the monaural signal to form a monaural modulation signal;

a plurality of signal-delaying means for each delaying the monaural modulation signal from the signal-modulating means, by respective delay amounts different from each other, to form delayed modulation signals;

second signal-mixing means for selecting and adding up combinations of desired ones of the delayed modulation signals to form mixed signals; and third signal-mixing means for adding the mixed signals to the sound signals for producing the stereophonic sound, respectively, to output new sound signals for producing the stereophonic sound.

According to this aspect of the invention, there are produced a lot of different delayed modulation signals which are spatially separate from each other, and combinations of desired ones of the delayed modulation signals are further added up and output by second signal-mixing means, so that the monaural original sound signal prepared by the first signal-mixing means is formed into signals for addition to the sound signals for producing the stereophonic sound. The resulting stereophonic sound signals contain a plurality of separate signal components largely spaced in time, which makes it possible to realize an even deeper chorus effect.

The above and other objects, features, and advantages of the invention will become more apparent from the ensuing detailed description taken in conjunction with the accompanying drawings.

DETAILED DESCRIPTION

The invention will now be described in detail with reference to drawings showing a preferred embodiment thereof.

First, the construction of a sound effect-creating device according to the embodiment of the invention will be described. In the present embodiment, a computer is used to perform digital processing of signals with the aid of software. Therefore, for the sake of convenience of explanation, the concept of construction of the sound effect-creating device will be described with reference to FIG. 2.

Figure 1:
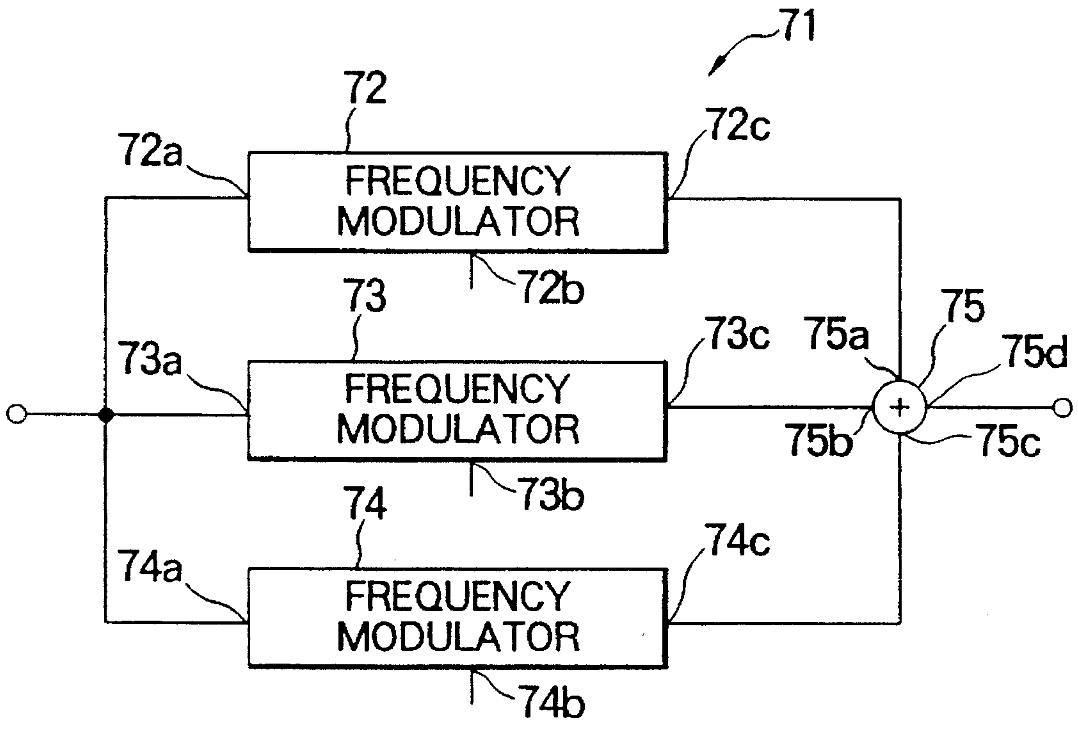
FIG. 1 PRIOR ART
FIG. 1 is a circuit diagram showing a conventional sound effect-creating device.
Figure 2:
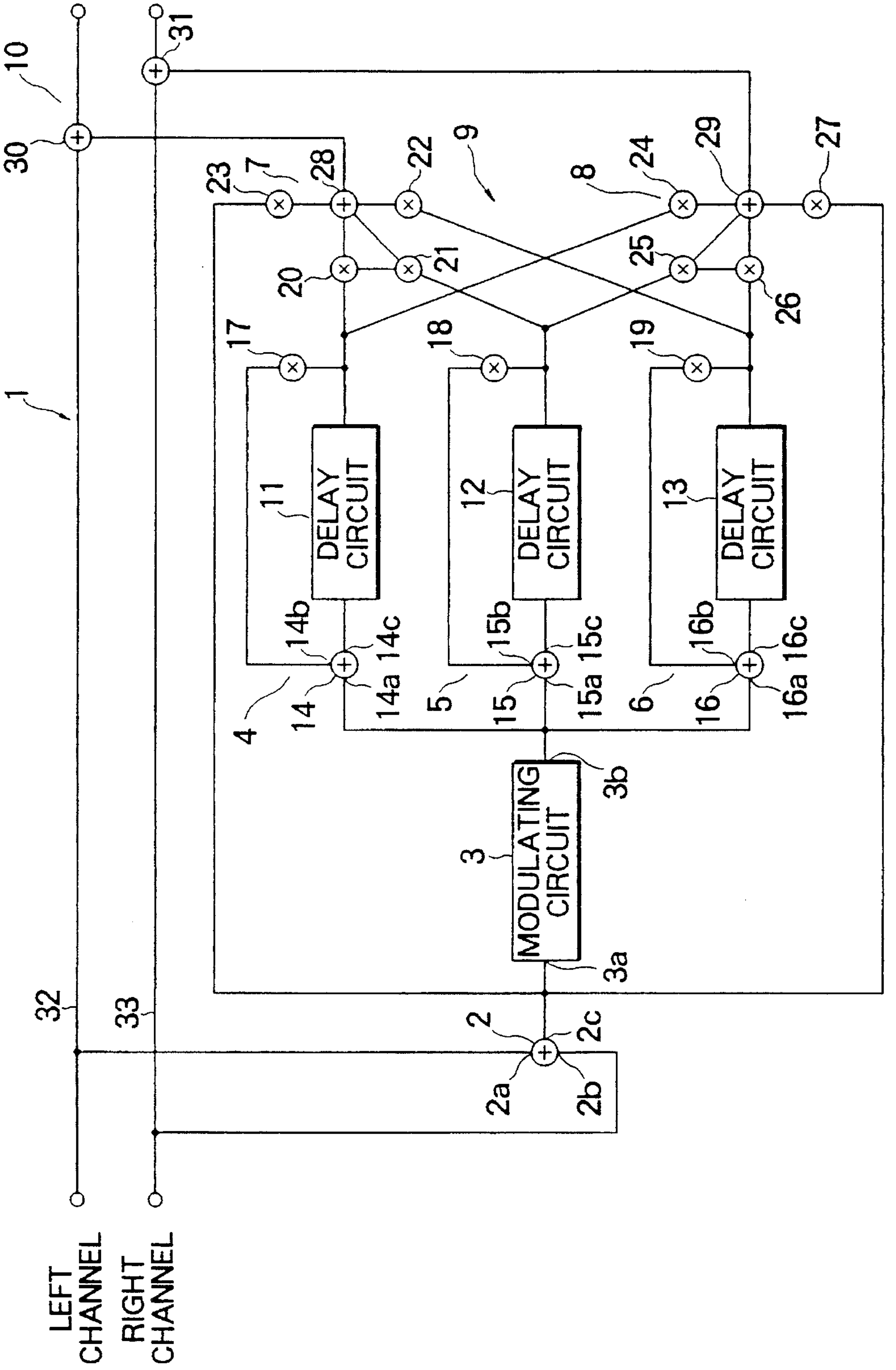
FIG. 2 is a circuit diagram which is useful in explaining the concept of construction of a sound effect-creating device according to the invention.

In FIG. 2, reference numeral 1 generally designates the sound effect-creating device according to the invention, which comprises a first mixing circuit (first signal-mixing means 2, a single modulating circuit 3, a plurality of signal-delaying means 4, 5, and 6, second signal-mixing means 9 formed by two mixing circuits 7 and 8, third signal-mixing means 10 formed by two mixing circuits 30 and 31, and left and right channels 32 and 33.

The first mixing circuit 2 forms a monaural original sound signal, by adding up separate stereophonic original sound signals artificially produced in a manner corresponding to a key of a keyboard of an electronic musical instrument, not shown. This circuit 2 has input terminals 2*a* and 2*b* connected to left and right channels 32 and 33, respectively. The left and right channels 32 and 33 are connected via arithmetic circuits, D/A converters, audio amplifiers to left and right loudspeakers, neither of which are shown, for producing a stereophonic sound. On the other hand, the first mixing circuit 2 has an output terminal 2*c* connected to an input terminal 3*a* of the modulating circuit 3.

The modulating circuit 3 carries out frequency modulation of the monaural original sound signal as a signal to be modulated, and has a modulating signal-generating circuit, not shown, incorporated therein which is capable of changing the frequency of the modulating signal. In the present embodiment, the input signal is frequency-modulated by the use of a modulating signal having a frequency of 5 Hz to output a frequency-modulated signal from an output terminal 3*b* thereof to the signal-delaying means 4, 5, and 6.

The signal-delaying means 4, 5, 6 timewise delays the frequency-modulated signal supplied from the modulating circuit 3 and are each composed of respective delay circuits 11, 12, 13, respective mixing circuits 14, 15, 16 for mixing the frequency-modulated signal supplied from the modulating circuit 3 with delayed modulation signals supplied thereto in a feedback manner from the delay circuits 11, 12, 13, respectively, and respective feedback amount-setting circuits 17, 18, 19 for changing the feedback amounts of the delayed modulation signals. The mixing circuits 14, 15, 16 have one input terminals 14*a*, 15*a*, 16*a* connected to the output terminal 3*b* of the modulating circuit 3, the other input terminals 14*b*, 15*b*, 16*b* connected to output sides of the feedback amount-setting circuits 17, 18, 19, and output terminals 14*c*, 15*c*, 16*c* connected to input sides of the delay circuits 11, 12, 13, respectively. The output sides of the delay circuits 11, 12, 13 are connected to input sides of the feedback amount-setting circuits 17, 18, 19, respectively, as well as to the second mixing means 9. In this connection, the amounts of delay to be effected by the delay circuits 11, 12, 13 can be set by a player as desired by selecting switches provided on the electronic musical instrument, not shown, for setting the amounts of delay.

Further, the amounts of feedback effected by the feedback amount-setting circuits 17, 18, 19 can be freely set by a player to respective desired values selected from a range of 0 to 1 by varying volume knobs, not shown, for setting the amounts of feedback.

The second mixing means 9 is formed by the two mixing circuits 7 and 8 as mentioned above, for each adding up a combination of selected ones of the three delayed modulation signals from the delay circuits 11, 12, 13 which are different in delay from each other, and the monaural original sound signal from the first mixing circuit 2. The mixing circuit 7 is composed of amplitude control circuits 20, 21, 22, 23 provided on the input side thereof for controlling the amplitudes of the delayed modulation signals and the monaural original sound signal, and a mixing circuit 28 for adding up a combination of selected ones of the delayed modulation signals and the monaural original sound signal each controlled with respect to amplitude, and the mixing circuit 8 is composed of amplitude control circuits 24, 25, 26, 27 provided on the input side thereof for controlling the amplitudes of the delayed modulated signals and the monaural original sound signal, and a mixing circuit 29 for adding up a combination of selected ones of the delayed modulation signals and the monaural original sound signal each controlled with respect to amplitude.

The amplitude control circuits 20, 21, 22, 23 have input sides thereof connected to the output sides of the delay circuits 11, 12, 13, and the output terminal 2*c* of the first mixing circuit 2, respectively, and all output sides thereof to the input side of the mixing circuit 28.

Similarly, the amplitude control circuits 24, 25, 26, 27 have input sides thereof connected to the output sides of the delay circuits 11, 12, 13, and the output terminal 2*c* of the first mixing circuit 2, respectively, and all output sides thereof to the input side of the mixing circuit 29.

The amplitude control circuits 20 to 27 each have the function of multiplying the amplitude of an input signal by a coefficient selected from a range of −1 through 0 to+1.

The third mixing means 10 is formed by a mixing circuit 30 for mixing a resulting mixed signal from the mixing circuit 28 of the second mixing means 9 with the stereophonic original sound signal transmitted thereto via the left channel 32, and a mixing circuit 31 for mixing a resulting mixed signal from the mixing circuit 29 of the second mixing means 9 with the stereophonic original sound signal transmitted thereto via the right channel 33. The mixing circuits 30, 31 have one input terminal thereof connected to the output sides of the mixing circuits 28, 29, respectively, and the other input terminal thereof connected to the left and right channels 32, 33, respectively. Further, the mixing circuits 30, 31 have output terminals thereof connected via the left and right channels 32, 33 to the arithmetic circuits, not shown.

Figure 3:
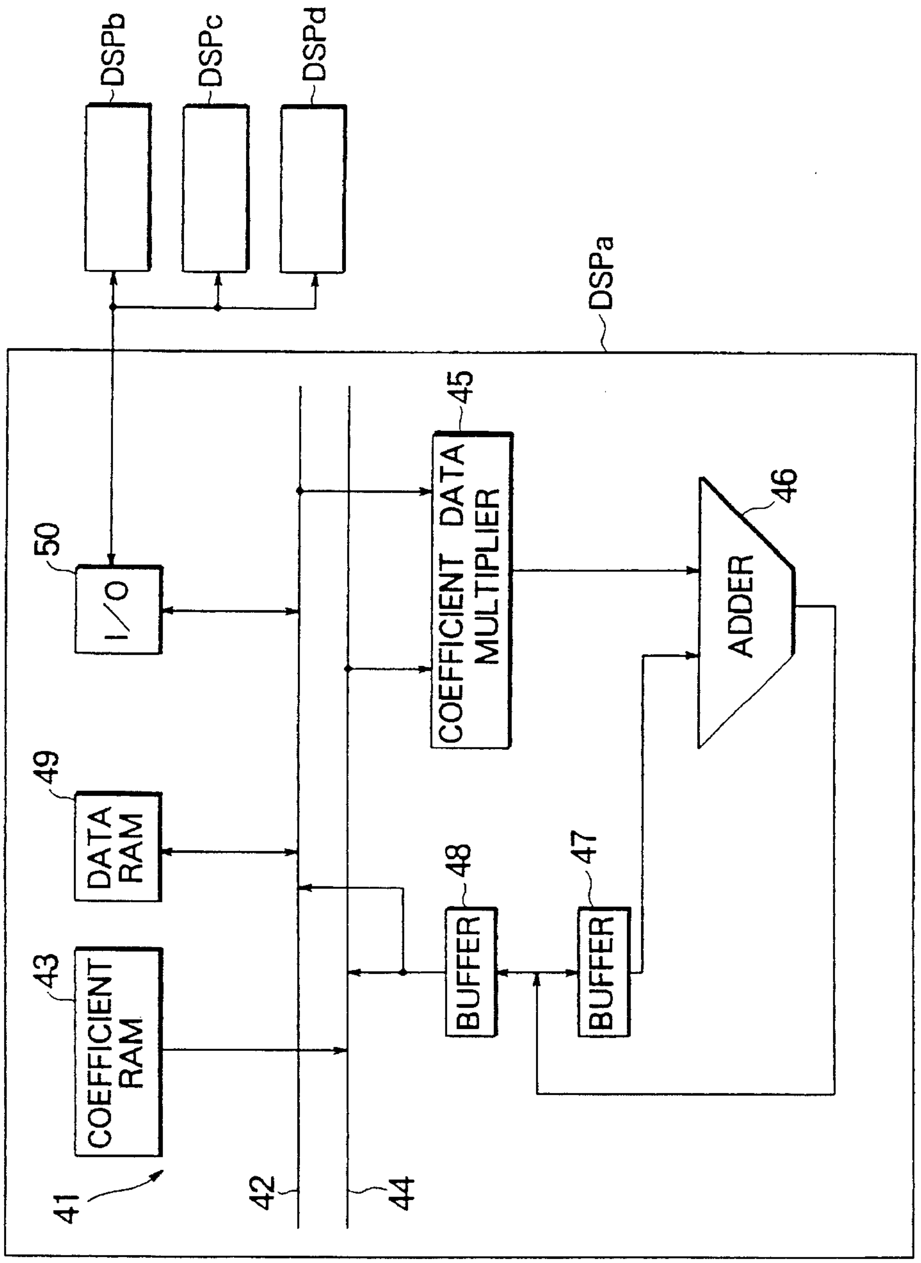
FIG. 3 is a block diagram showing the configuration of digital signal processor (DSP) means used for the sound effect-creating device according to the invention.

Next, the operation of the sound effect-creating device 1 of the pro, sent invention will be described in detail with reference to FIG. 3 and FIG. 4. FIG. 3 shows the construction of DSP (Digital Signal Processor) means which implements the sound effect-creating device 1 shown in FIG. 2, according to the present embodiment. The DSP means is comprised, though not particularly limited, of four DSP's (DSPa to DSPd) each having a completely identical construction. Therefore, FIG. 3 shows details of the construction of the DSPa as a representative of the remaining three, and hereafter, identical elements in each DSP will be referred to by identical reference numerals. The DSPa 41 performs the operations of the first mixing circuit 2, the modulating circuit 3, the second signal-mixing means 9, and the third signal-mixing means shown in FIG. 2, while the DSPb to DSPd perform the operations of the delay circuits 11, 12, 13, respectively. In addition, the DSPa to DSPd are connected to each other via an I/O (input/output device) 50 of each DSP by a data bus.

Figure 4:
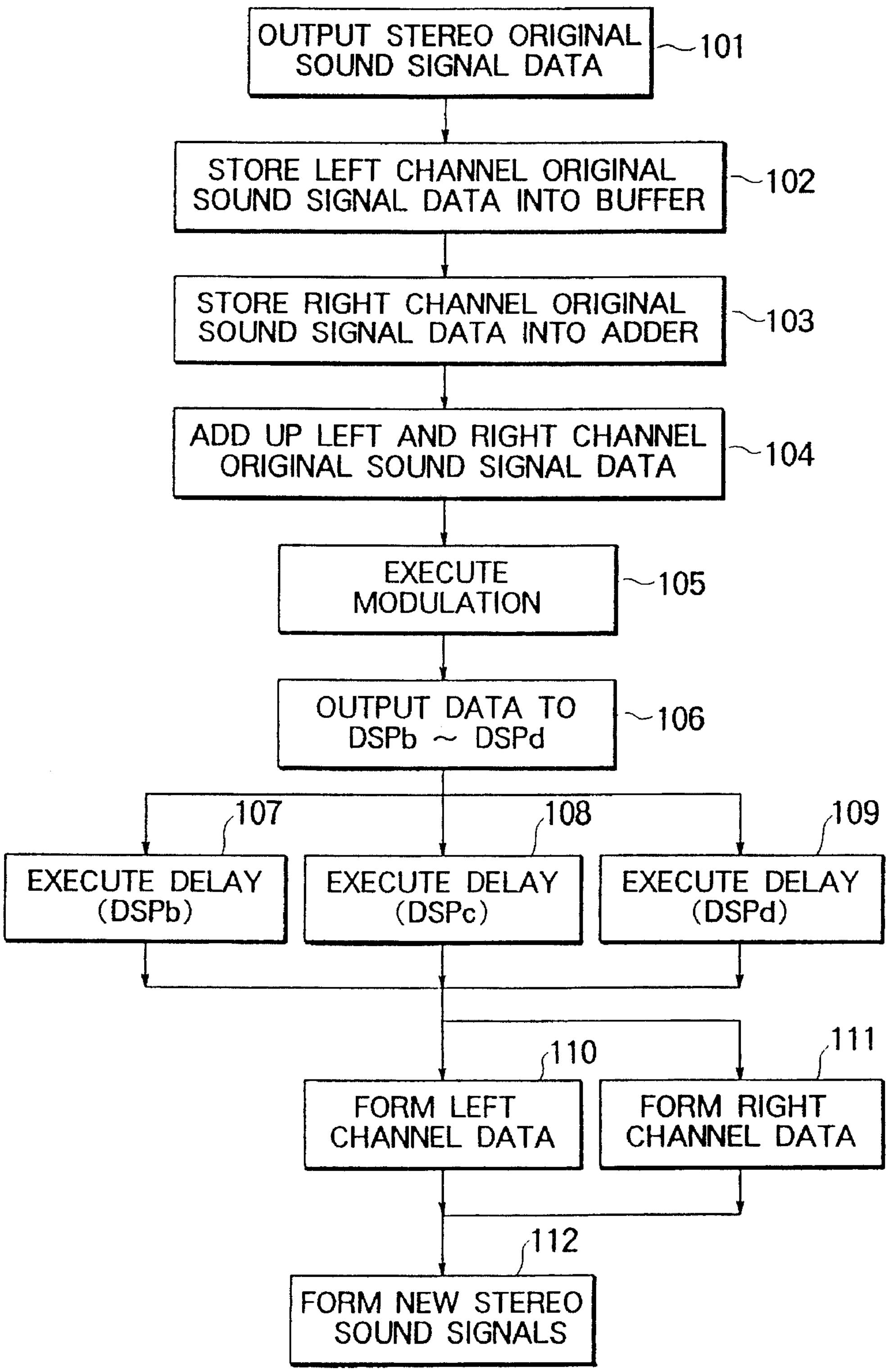
FIG. 4 is a flowchart of operation of the sound effect-creating device according to the invention.

Next, the operations of the DSPa to DSPd in FIG. 3 will be described in detail with reference to FIG. 4 showing a flowchart of the operations.

First, when a player depresses a key on the keyboard of the electronic musical instrument, such as an electronic piano, not shown, with switches and the like, not shown, selectively operated in a manner corresponding to a desired type of the ensemble effect, a microcomputer (hereinafter referred to as "the CPU"), not shown, reads data of stereophonic original sound signals each in the form of a digital signal formed of data pieces each having 24 bits, which are transmitted through the left and right channels 32, 33, from an original sound data RAM, not shown. In this connection, the original sound data RAM is incorporated in a system controller, not shown, and stores data on the waveforms of original stereophonic sounds respectively corresponding to the keys of the keyboard. Data of the stereophonic original sound signals thus read are output to the left and right channels 32, 33 by a predetermined repetition period (step 101).

Next, the mixing operation of the first mixing circuit 2 appearing in FIG. 2 will be described. The first mixing circuit 2 adds up the stereophonic original sound signals to form a monaural original sound signal (steps 102 to 104). The steps 102 to 104 will now be described in detail.

The CPU reads a data piece of one of the stereophonic original sound signals for the left channel 32 in the form of a 24-bit digital signal from the original sound data RAM, and deposits same on a data bus 42. A multiplier 45 takes in the data piece of the original sound signal from the data bus 42, and temporarily stores it into an internal data register thereof, not shown. Then, according to selection of a type of the ensemble effect by the player, a coefficient data piece of 16 bits stored in a coefficient RAM 43 is read out from the coefficient RAM 43 and deposited on a coefficient bus 44 under the control of the CPU. In this connection, a coefficient represented by the coefficient data piece is not particularly limited, but let it be assumed that it has a value of 1 in the present embodiment. The multiplier 45 stores the coefficient data piece into an internal coefficient register thereof, not shown, and multiplies the data piece of the original sound data already stored therein by the coefficient data piece. The data piece after multiplication is transferred via an adder 46 to a buffer 47 for storage, under the control of the CPU (step 102).

Next, a data piece of one of the stereophonic original sound signals for the right channel 33 is input via the data bus 42 to the multiplier 45 in a manner similar to the step 102, where the data piece is multiplied by a coefficient data piece indicative of a coefficient (let it be assumed that the coefficient has a value of 1 according to selection by the player similarly to the step 101), and the resulting data piece is stored into the adder 46 (step 103).

Then, the data piece of the stereophonic original sound for the left channel already stored in the buffer 47 is input to the adder 46, where the two data pieces of the stereophonic original sound signals for the left and right channels 32, 33 are added up to form a data piece of a monaural original sound signal. This data piece is stored into a predetermined address location within a data RAM 49 via a buffer 48 (step 104). The adding-up operation of the first mixing circuit 2 appearing in FIG. 2 is completed by carrying out the operations described above at predetermined time intervals under the control of the CPU.

Next, the frequency-modulating operation of the modulating circuit 3 appearing in FIG. 2 will be described with reference to FIG. 3. The modulating circuit 3 frequency-modulates the data piece of the monaural original sound signal formed at the step 104 (step 105). Details of the operation will now be given. A data piece of the monaural original sound signal stored in the data RAM 49 is deposited on the data bus 42. In reading out the data piece, the address therefor in the data RAM 49 is modulated by a modulating signal having a frequency corresponding to a selection by a player, e.g. 5 Hz. The data piece of the original sound data signal is stored into a predetermined address location in the data RAM 49 again. This operation is repeatedly carried out on a sequence of data pieces of the original sound signal to thereby complete the frequency modulation of the monaural original sound signal (step 105).

The data pieces of the monaural original sound signal stored in the data RAM 49 are sequentially deposited on the data bus in units of 24-bit data pieces, and output via the I/O 50 of the DSPa to the I/O's 50 of the DSPb to DSPd and via the data bus 42 into predetermined address locations in each data RAM 49 of the DSPb to DSPd (step 106).

Next, the delaying operations by the signal-delaying means 4 appearing in FIG. 2 will be described with reference to FIG. 3. The signal-delaying operations of the delay circuits 11, 12, 13 of the signal-delaying means 4 are executed, in the present embodiment, by parallel processing of the DSPb to DSPd in parallel operation under the control of the CPU for delaying the data piece of the frequency-modulated original sound signal by delay amounts selected by the player (steps 107 to 109). In the present embodiment, the delay amounts are set to 50 msec., 100 msec., and 150 msec., for the DSPb to DSPd, respectively. The details of the operations will now be described.

A first data piece of the monaural original sound signal stored in the data RAM 49 of the DSPb is first output via a data bus 42 thereof to a multiplier 45 thereof. On the other hand, a data piece of a coefficient as a feedback ratio (having a value of 0.1 in the present embodiment), selected by the player from those stored in a coefficient RAM 43 of the DSPb, is simultaneously output via a coefficient bus 44 of same to the multiplier 45, where the data piece is multiplied by the coefficient data piece. The resulting multiplied data piece is transferred via an adder 46 into a buffer 47. This data piece corresponds to a portion of the delayed modulation signal which is determined by the feedback amount-setting circuit 17 and supplied to the input side of the delay circuit 11 in a feedback manner, as described with reference to FIG. 2. Next, a second data piece of the frequency-modulated monaural original sound signal is output from the data RAM 49 via the data bus 42 and the multiplier 45 to the adder 46. This second data piece and the preceding data piece stored in the buffer 47 and read out therefrom are added up in the adder 46. The resulting data piece is stored into a buffer 48 as a new data piece, and at the same time transferred therefrom via the data bus 42 to the data RAM 49 to be stored into a predetermined address location therein as a data piece following the first data piece already stored therein.

Next, the data piece stored in the buffer 48 is output to the multiplier 45 where it is multiplied again by the coefficient of 0.1. The resulting multiplied data piece is stored into the buffer 47. Then, a third data piece of the frequency-modulated monaural original sound signal is output from the data RAM 49 via the data bus 42 and the multiplier 45 to the adder 46, where the third data piece and the data piece already stored in the buffer 47 and read therefrom are added up. The resulting data piece is processed in the same manner as described above. Thus, a portion of a first data piece corresponding to 10% of amplitude of the original sound signal is added to a second data piece, and thereafter, a potion of the resulting added-up data piece corresponding to 10% of amplitude of the original sound signal is added to a following data piece in a sequential repeated manner, whereby portions of the foregoing original sound signal components become present in the resulting data of the monaural original sound signal.

The resulting data pieces stored in the data RAM 49 of the DSPb is sequentially output via the data bus 42, the I/O 50 thereof, and the I/O 50 of the DSPa to the data RAM 49 of the DSPa, whenever a time period of 50 msec elapses. These data pieces correspond to the delayed modulation signal formed by the delay circuit 11 in FIG. 2 (step 107). Similarly, the DSPc and the DSPd execute the delaying operations of the delay circuits 12 and 13 by delaying amounts of 100 msec and 150 msec, respectively (steps 108 and 109). Thus completed are the delaying operations of the signal-delaying means 4, 5, 6.

Next, the mixing operation of the second signal-mixing means 9 appearing in FIG. 2 will be described. The second signal-mixing means 9, which is implemented by the DSPa in the present embodiment, sets data pieces of the three delayed modulation signals output from the signal-delaying means 4 to predetermined signal amplitude levels according to the player's free selection and at the same time adds up a combination of resulting data pieces modified to the selected amplitude levels, thereby forming data pieces of sound signals for the stereophonic sound signals of the left and right channels 32, 33 (steps 110 and 111). The details of the mixing operation of the second signal-mixing means 9 will now be described.

First, the operations of the amplitude control circuits 20, 21, 22, 23 shown in FIG. 2 for explanation of the concept of the invention will be described with reference to FIG. 3. Among the data pieces of the delayed modulation signals stored in predetermined address locations within the data RAM 49 of the DSPa, a data piece of the delayed modulation signal from the delay circuit 11 is output to the multiplier 45, where it is multiplied by a coefficient data piece output from the coefficient RAM 43 as an attenuating ratio properly selected by the player. In this connection, the attenuating ratio is not particularly limited, but it can be set, for example to a value of 1. In such a case, the delayed modulation signal from the delay circuit 11 is supplied to the mixing circuit 28 without being modified in amplitude. However, if the player selects to invert the sign of amplitude of the signal without changing the magnitude of amplitude, a coefficient of −1 will be used. The resulting multiplied data piece is transferred via the adder 46 to the buffer 47 to be temporarily stored therein. Then, a data piece of the delayed modulation signal from the delay circuit 12 is output via the data bus 42 into the multiplier 45, where it is multiplied by a coefficient data piece output from the coefficient RAM 43 as an attenuating ratio properly selected by the player. The resulting multiplied data piece is supplied to the adder 46 where it is added up with the preceding data piece stored in the buffer 47 and read out therefrom, to form a new data piece, which is supplied to the buffer 47 for storage therein. In addition, the data piece of the delayed modulation signal from the delay circuit 12 is also multiplied e.g. by a coefficient of 1. However, as described above, it is possible to invert the sign of amplitude by selecting a coefficient of −1. Then, a data piece of the delayed modulation signal from the delay circuit 13 is output via the data bus 42 into the multiplier 45, where it is multiplied by a coefficient data piece output from the coefficient RAM 43 as an attenuating ratio properly selected by the player. The resulting multiplied data piece is supplied to the adder 46, where it is added up with the preceding updated data piece stored in the buffer 47 and read out therefrom, and the resulting added-up data piece is transferred via the buffer 48 to a predetermined address location within the data RAM 49 as a data piece of the so and signal for the stereophonic sound signal of the left channel 32. In addition, the data piece as the delayed modulation signal from the delay circuit 13 is also multiplied e.g. by a coefficient of 1, but as described above it is possible to select e.g. a coefficient of −1 to invert the sign of the amplitude the output data piece. Further, the player can selectively add a data piece corresponding to an output from the first mixing circuit 2 before frequency modulation described above to the data pieces from the delay circuits by the use of the DSPa. Through these additions of the data pieces, the resulting sound signal is comprised of signal components derived from a plurality of different signals shifted in respect of time. This completes the mixing operation of the mixing circuit 7 (step 110) The mixing operation of the mixing circuit 8 is carried out in a similar manner, and the resulting data piece of the sound signal for the stereophonic sound signal for the right channel 33 thus obtained is stored into the data RAM 49 (step 111). This completes the mixing operation of the second signal-mixing means 9.

Thus, it is possible for the mixing circuits 28, 29 in FIG. 2 to add up any combination of selected ones of the three delayed modulation signals and the monaural original sound signal before modulation as desired. Further, it is possible to perform setting of the amplitudes of all these signals to desired levels before addition thereof, including inversion of the sign of amplitude of any selected signal, if desired.

Next, the mixing operation of the third signal-mixing means 10 shown in FIG. 3 for explanation of the concept of the invention will be described below with reference to FIG. 4. The third signal-mixing means 10 adds data pieces of the sound signals for the stereophonic sound signals of the left and right channels prepared as described heretofore to data pieces of the stereophonic original sound signals transmitted via the left and right channels 32, 33, respectively, to form data pieces of new stereophonic sound signals (step 112). The details of this operation will now be described.

A data piece of the sound signal for the left-channel stereophonic sound signal stored in the data RAM 49 of the DSPa as an output from the mixing circuit 7 is output therefrom to the buffer 47 via the data bus 42, the multiplier 45 and the adder 46. On the other hand, a data piece of the stereophonic original sound signal of the left channel 32 already stored in the data RAM 49 is output therefrom via the data bus 42 and the multiplier 45 to the adder 46, where it is added up with the data piece for the sound signal already stored in the buffer 47 and read out therefrom. The resulting added-up data piece forms a data piece of a new stereophonic sound signal prepared by the mixing circuit 30 of the third signal-mixing means 10. This data piece is output via the; I/O 50 of the DSPa to the arithmetic circuit, not shown. To a data piece of the stereophonic original sound signal of the right channel 33, there is similarly added a data piece therefor as an output from the mixing circuit 8, and the resulting data piece is supplied to the arithmetic circuit, not shown. This completed is the mixing operation of the third signal-mixing means 10 (step 112), and as a result there are formed new data pieces of the stereophonic sound signals for the left and right channels 32 and 33, which are formed, as described heretofore, by addition of the delayed modulation signals prepared based on the monaural original sound signal formed from the stereophonic original sound signals, to the stereophonic original sound signals.

Figure 5:
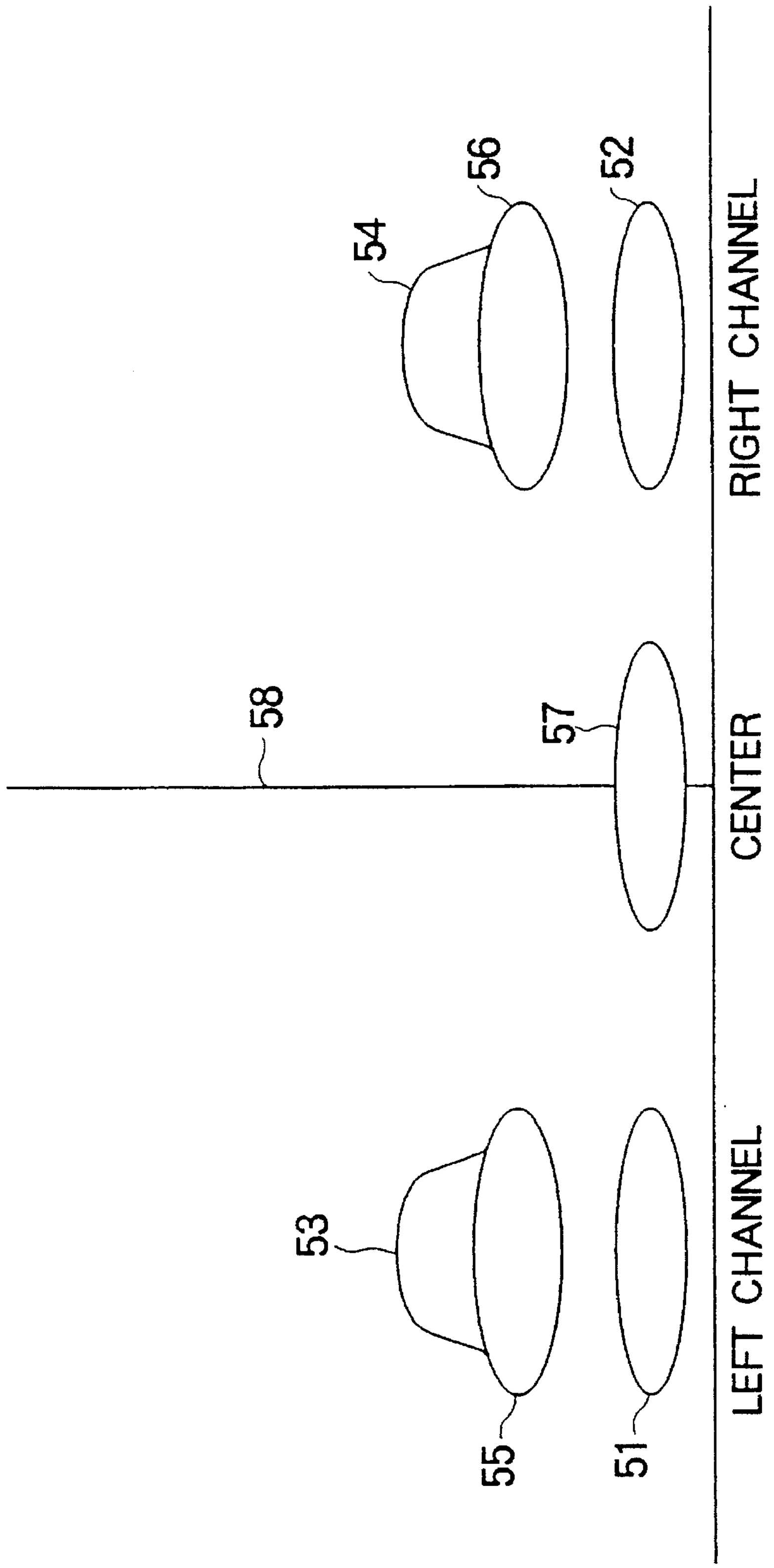
FIG. 5 is a diagram showing an example of sound image locations obtained by the sound effect-creating device according to the invention.

FIG. 5 shows an example of locations of sound images formed based on the new data pieces of the stereophonic sound signals for the left and right channels 32, 33 prepared as described heretofore. More specifically, this figure shows where sound images corresponding to components of the ultimate stereophonic signals are localized relative to the locations of the right and left loudspeakers, when the stereophonic signals for the left and right channels 32, 33 from the third mixing means 10 are converted into analog signals, amplified and then output as the stereophonic sound from the left and right loudspeakers.

A sound image 51 corresponds to the stereophonic original sound signal for the left channel 32, while a sound image 52 to that for the right channel 33. Sound images 53 and 54 correspond to delayed modulation signals which are formed by frequency-modulating the monaural original sound signal resulting from addition of the stereophonic original sound signals for the left and right channels 32, 33, delaying the resulting modulation signal by the delay circuits 11 and 12, and multiplying the delayed modulation signals by a coefficient of 1 in the amplitude control circuits 20 and 25, and then supplied to the mixing circuits 28, 29, respectively. A sound image 55 corresponds to a component resulting from the delayed modulation signal from the delay circuit 13 which is multiplied by a coefficient of 1 in the amplitude control circuit 22. A sound image 57 corresponds to the monaural original sound signal obtained by addition of the stereophonic original sound signals for the left and right channels 32, 33. A line 58 indicates the center between the left and right loudspeakers. In this connection, if the amplitude control circuit 26 employs, for example, a coefficient of −1 instead of the above coefficient of 1, in forming the above-mentioned data piece for the stereophonic sound signal for the right channel 33, the sound images 55 and 56 represent respective sound components which are identical in amplitude level, and opposite in phase, i.e. different from each other by 180 degrees.

According to FIG. 5, when combinations of delayed modulation signals are selected by the second and third mixing means 9 and 10 for addition, the ultimate stereophonic sound signals for the left and right channels contain, in addition to the stereophonic original sound signals for the left and right channels, lots of signal components which are identical in frequency and delayed in phase, and hence sound components indicated by sound images 53, 54, 55, 56 are generated thereby, giving the chorus effect to the original sound. Further, if the coefficients used in the amplitude control circuits 20 to 27 are set to different values, sound is produced from the left and right loudspeakers based on a plurality of pairs of modulation signals input thereto which have the same delay amounts but different amplitude levels, determining a certain pattern of sound image localization. Therefore, it is possible to obtain a different pattern of sound image localization by varying the coefficients used in the amplitude control circuits 20 to 27. As a result, the sensation of spread of sound can be variously changed to thereby increase stereophonic impressions of a sound produced. Further, by virtue of the presence of frequency-modulated signals, it is possible to realize the vibrato effect of giving vibrations to the sound.

Figure 6:
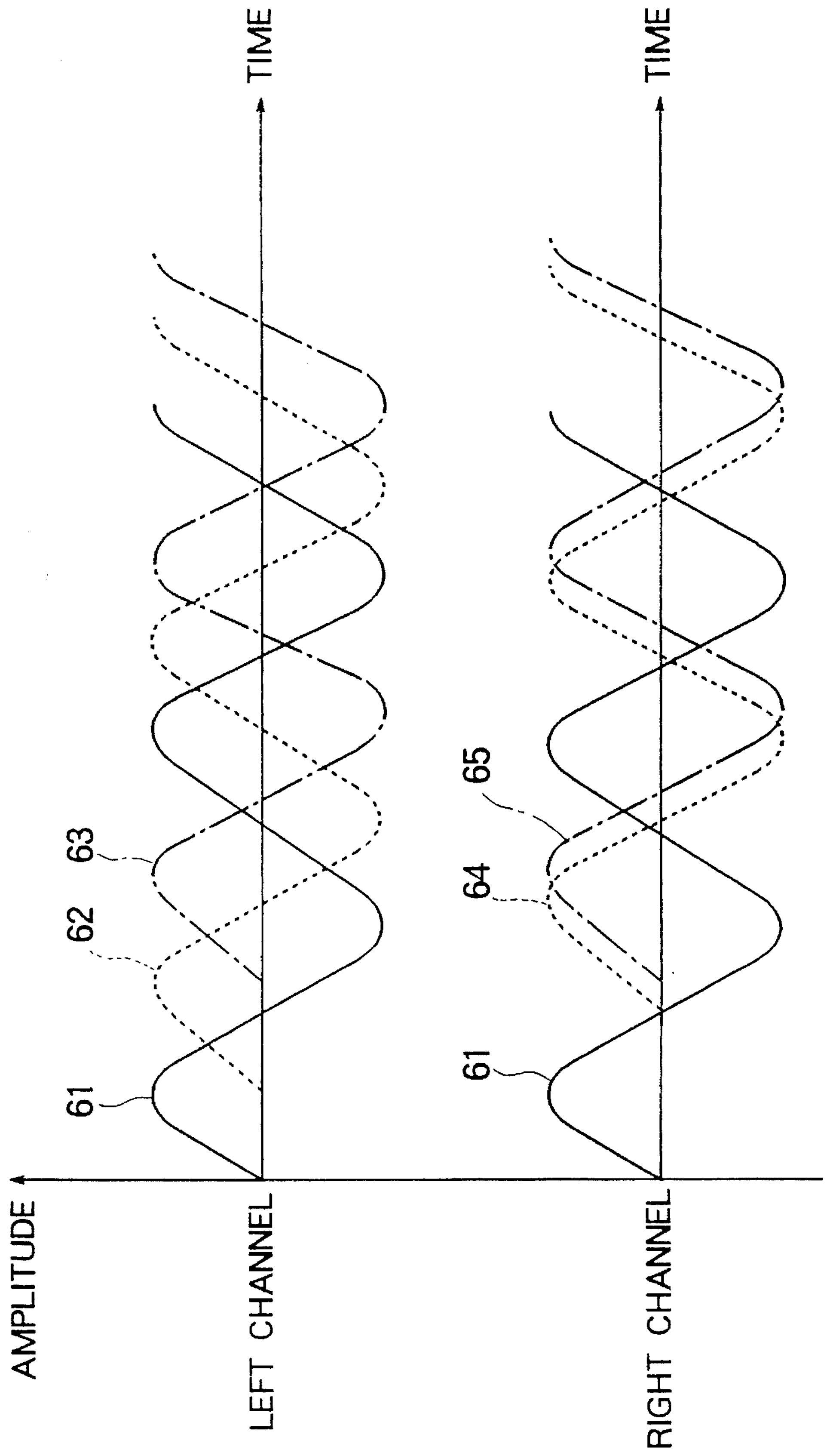
FIG. 6 is a diagram showing an example of relationship in phase between delayed modulation signals obtained by the sound effect-creating device according to the invention.
Figure 7:
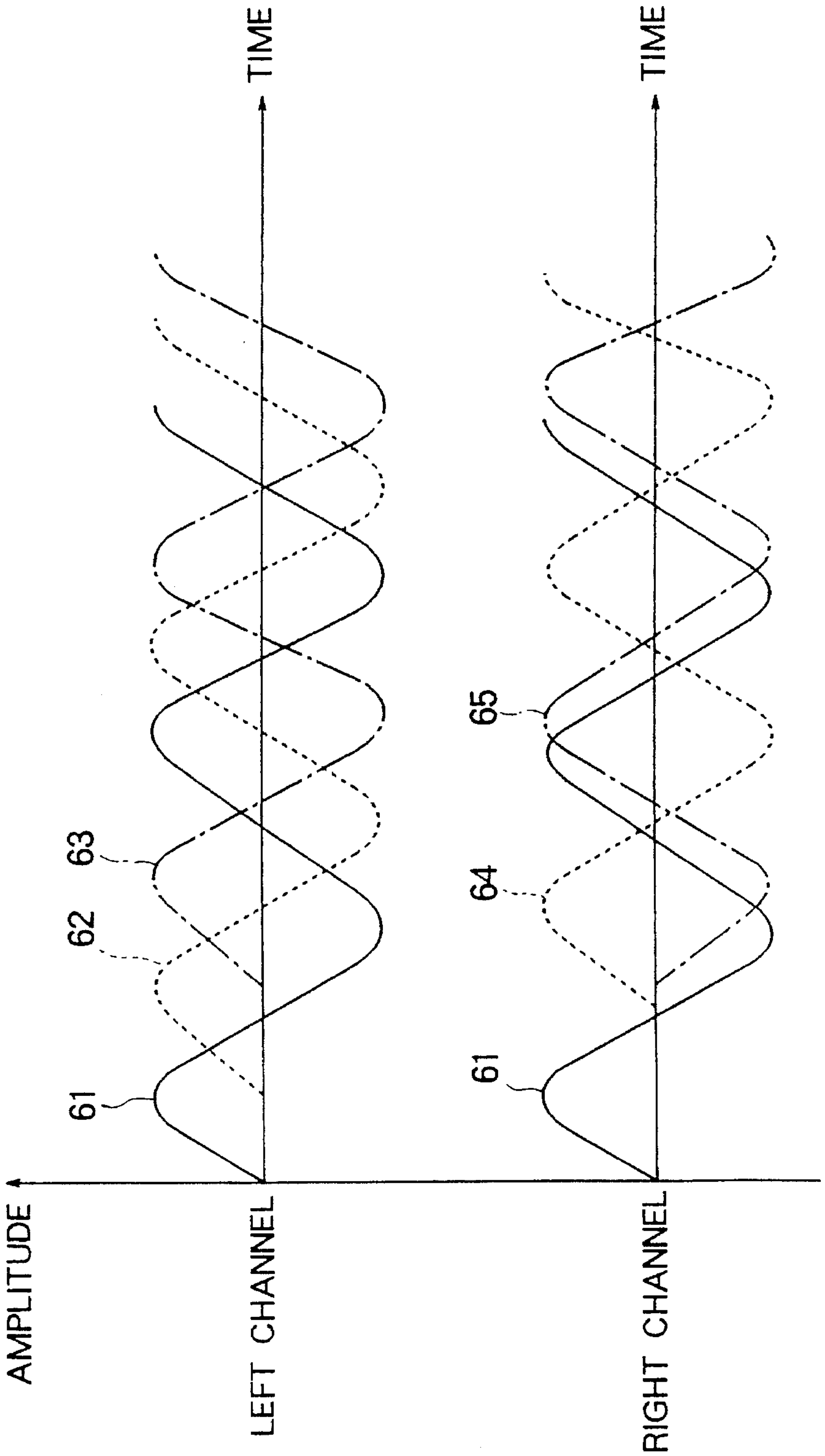
FIG. 7 is a diagram showing another example of relationship in phase between delayed modulation signals obtained by the sound effect-creating device according to the invention.

FIG. 6 and FIG. 7 show relationships in phase between the delayed modulation signals with reference to the monaural original sound signal obtained by addition of the stereophonic original sound signals. Referring first to FIG. 6, which shows a case in which the coefficients of the amplitude control signals 20, 22, 25, 26 are set to a value of 1. Reference numeral 61 designates the monaural original sound signal obtained by the first mixing circuit 2, reference numeral 62 the delayed modulation signal output from the delay circuit 11 and multiplied by the coefficient of 1 in the amplitude control circuit 20, which corresponds to the sound image 53 in FIG. 5, and reference numeral 63 the delayed modulation signal output from the delay circuit 13 and multiplied by the coefficient of 1 in the amplitude control circuit 22, which corresponds to the sound image 55 in FIG. 5. Further, reference numeral 64 designates the delayed modulation signal output from the delay circuit 12 and multiplied by the coefficient of 1 in the amplitude control circuit 25 which corresponds to the sound image 54 in FIG. 5, and reference numeral 65 the delayed modulation signal output from the delay circuit 13 and multiplied by the coefficient of 1 in the amplitude control circuit 26, which corresponds to the sound image 56 in FIG. 5.

Next, FIG. 7 shows a case in which the coefficients of the amplitude control circuits 20, 22, 25 are set to a value of 1, but the coefficient of the amplitude control circuit 26 is set to a value of −1. In this figure, the delayed modulation signal from the delay circuit 13 designated by reference numeral

66, which corresponds to the sound image 56 in FIG. 5, is different from the corresponding one 65 in FIG. 6, in that the former in FIG. 7 is inverted with respect to the sign of the amplitude level.

As is clear from FIG. 6 and FIG. 7, there are a plurality of signal components having the same frequency and different phases which are substantially delayed in time relative to the phase of the monaural original sound signal 61, which makes it possible to impart the deep chorus effect of giving one player's listeners impressions as if they were listening to music played by a plurality of players. In this case, the delay amounts of the signal-delaying means 4, 5, 6 can be changed as desired, which makes it possible to vary the depth of the chorus effect as desired. Further, signal components corresponding to the delayed modulation signals 62 and 64 present in the left and right channels 32, 33 are different in delay relative to the monaural original sound signal 61, and hence sound components output from the left and right loud speakers corresponding thereto are not canceled by each other, which causes the listeners to feel separate sounds being produced from the left and right loudspeakers, giving the sense of spread of sound. Further, if feedback of the delayed modulation signal is performed by the feedback amount-setting circuit 17, it causes a component of an identical signal to remain in the following part of the signal, whereby it is possible to impart the echo effect of producing repeated tones to the sound produced.

Further, it is to be understood that the present invention is not limited to the preferred embodiment described above. For example, the number of DSP's is not limited to four, but more than or alternatively less than four DSP's may be used. Further, various changes and modifications may be made to details of control of the DSP's without departing the scope of the present invention. Further, the signal-modulating means may be changed, if desired, e.g. by using the phase-modulating circuit instead of the frequency-modulating circuit.

What is claimed is:

1. A sound effect-creating device comprising:

a signal-modulating means for frequency-modulating a sound signal representative of a sound, to form a modulation signal;

a plurality of signal-delaying means, each for separately delaying said modulation signal from said signal-modulating means, by respective delay amounts different from each other, to form delayed modulation signals; and a plurality of signal-mixing means, each of said signal mixing means connected to said plurality of signal-delaying means, each for selecting and adding up a combination of any desired ones of said delayed modulation signals to output a mixed signal.

2. A sound effect-creating device according to claim 1, wherein each of said signal-delaying means supplies part of said delayed modulation signal to an input side of said each of said signal-delaying means in a feedback manner.

3. A sound effect-creating device according to claim 2, wherein each of said signal-mixing means has an amplitude control circuit for controlling an amplitude level of each of said delayed modulation signals supplied thereto.

4. A sound effect-creating device according to claim 2, wherein each of said signal-mixing means adds said sound signal to any desired ones of said delayed modulation signals.

5. A sound effect-creating device according to claim 1, wherein each of said signal-mixing means has an amplitude control circuit for controlling an amplitude level of each of said delayed modulation signals supplied thereto.

6. A sound effect-creating device according to claim 5, wherein said amplitude control circuit inverts the sign of an amplitude level of at least one of said delayed modulation signals.

7. A sound effect-creating device according to claim 6, wherein each of said signal-mixing means adds said sound signal to any desired ones of said delayed modulation signals.

8. A sound effect-creating device according to claim 5, wherein each of said signal-mixing means adds said sound signal to any desired ones of said delayed modulation signals.

9. A sound effect-creating device according to claim 1, wherein each of said signal-mixing means adds said sound signal to any desired ones of said delayed modulation signals.

10. A sound effect-creating device according to claim 1, wherein said signal-modulating means, said signal-delaying means, and said signal-mixing means are formed by digital signal processor means.

11. A sound effect-creating device comprising:

a plurality of channels for transmitting sound signals for producing a stereophonic sound;

first signal-mixing means for taking out sound signals for producing said stereophonic sound from at least two of said plurality of channels, and adding said sound signals taken out, to form a monaural signal;

signal-modulating means for frequency-modulating said monaural signal to form a monaural modulation signal;

a plurality of signal-delaying means, each for delaying said monaural modulation signal from said signal-modulating means, by respective delay amounts different from each other, to form delayed modulation signals; and a plurality of second signal-mixing means, each of said signal mixing means connected to said plurality of signal-delaying means, each for selecting and adding up a combination of any desired ones of said delayed modulation signals to form mixed signals;

third signal-mixing means for adding said mixed signals to said sound signals for producing said stereophonic sound, respectively, to output new sound signals for producing said stereophonic sound.

12. A sound effect-creating device according to claim 11, wherein said third signal-mixing means comprises a plurality of mixing circuits each for mixing said mixed signals output from said second signal-mixing means with a different one of said sound signals for producing said stereophonic sound.

13. A sound effect-creating device according to claim 12, wherein each of said second signal-mixing means has an amplitude control circuit for controlling an amplitude level of each of said delayed modulation signal supplied thereto.

14. A sound effect-creating device according to claim 11, wherein each of said signal-delaying means supplies part of said delayed modulation signal to an input side of said each of said signal-delaying means in a feedback manner.

15. A sound effect-creating device according to claim 4, wherein each of said second signal-mixing means has an amplitude control circuit for controlling an amplitude level of each of said delayed modulation signal supplied thereto.

16. A sound effect-creating device according to claim 11, wherein each of said second signal-mixing means has an amplitude control circuit for controlling an amplitude level of each of said delayed modulation signal supplied thereto.

17. A sound effect-creating device according to claim 16, wherein said amplitude control circuit inverts the sign of an amplitude level of at least one of said delayed modulation signals.

18. A sound effect-creating device according to claim 11, wherein said first signal-mixing means, said signal-modulating means, said signal-delaying means, said second signal-mixing means, and said third signal-mixing means are formed by digital signal processor means.

* * * * *